US007136309B2

(12) United States Patent
Sapre et al.

(10) Patent No.: US 7,136,309 B2
(45) Date of Patent: Nov. 14, 2006

(54) FIFO WITH MULTIPLE DATA INPUTS AND METHOD THEREOF

(75) Inventors: Uday Shridhar Sapre, Plano, TX (US); Achuta Reddy Thippana, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 136 days.

(21) Appl. No.: 10/909,601

(22) Filed: Aug. 2, 2004

(65) Prior Publication Data

US 2006/0023541 A1 Feb. 2, 2006

(51) Int. Cl.
*G11C 7/10* (2006.01)

(52) U.S. Cl. ............. 365/189.02; 365/221; 365/230.05

(58) Field of Classification Search ........... 365/189.01, 365/189.02, 221, 230.05, 236, 239; 711/149
See application file for complete search history.

(56) References Cited

U.S. PATENT DOCUMENTS 6,118,724 A * 9/2000 Higginbottom ........ 365/230.05
6,266,746 B1 * 7/2001 Ando .......................... 711/154

2005/0078544 A1 * 4/2005 Vogel .................... 365/230.05

* cited by examiner

*Primary Examiner*—VanThu Nguyen
(74) *Attorney, Agent, or Firm*—Ronald O. Neerings; W. James Brady, III; Frederick J. Telecky, Jr.

(57) ABSTRACT

A FIFO circuit includes a memory such as a register array having a plurality of storage locations. One or more data inputs can be coupled to the memory for receiving data that is to be stored therein. A control circuit controls the storage of data received from the one or more data inputs into the memory. In one embodiment, a particular one (e.g., memory location 0) of the plurality of storage locations is used as the location from which all data from the memory is outputted from. A multiplexer is used to move the data from within the memory into this particular memory location. The control circuit includes circuitry which allows for data received from the one or more data inputs to be stored substantially at the same time into the memory. In another embodiment, the FIFO circuit includes one data input for receiving data from a write bus and a second data input for receiving data from a read bus. A counter is used to store the pointer to the storage location within the memory were the write bus data is to be stored and a FIFO is used to store the pointer information to the storage location within the memory were read data bus data is to be stored that is received by the FIFO circuit.

19 Claims, 3 Drawing Sheets

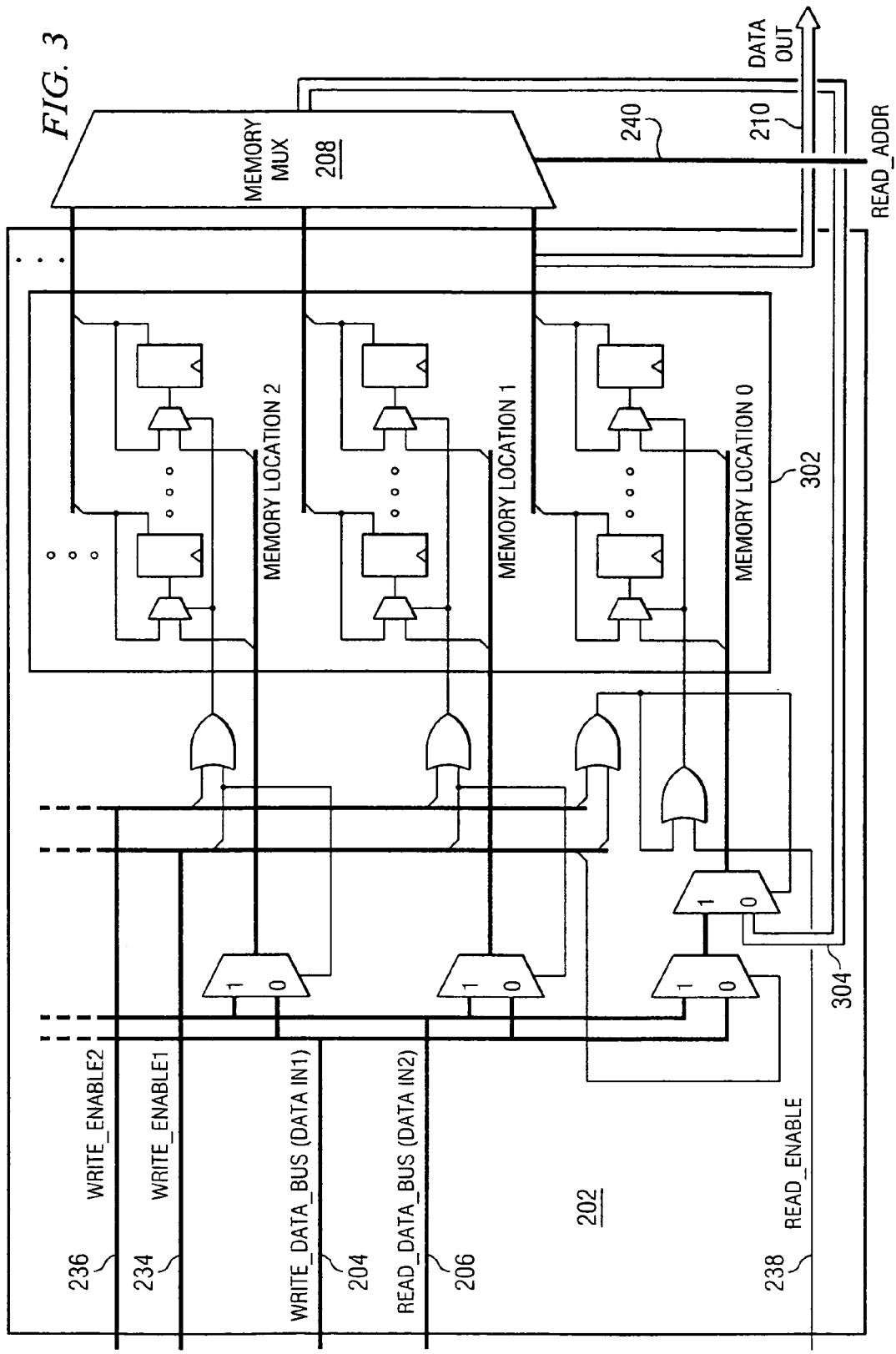

FIFO WITH MULTIPLE DATA INPUTS AND METHOD THEREOF

FIELD OF THE INVENTION

This invention relates in general to the field of electronics and more specifically to a FIFO (First-In First-Out) circuit that includes multiple data inputs and method thereof.

BACKGROUND

Referring to FIG. 1, there is shown a prior art FIFO circuit 100. FIFO circuit 100 includes a write data FIFO 102 coupled to a write data bus and a read data FIFO 104 coupled to a read data bus. An output multiplexer (MUX) 106 under the control of a data select signal 108 controls which data to present at the output (DATA_OUT) 110 of the MUX 106. FIFO circuit 100 is typically used for applications where data from both read and write data busses need to be captured, buffered and then presented to an output interface.

Considering an application where the data bus width is 64 bits wide and the buffering requirement is 16 data words in all, by using FIFO circuit 100 both the write data FIFO 102 and the read data FIFO 104 have to have a width of 64 bits and a depth of 16. Since both the write data FIFO 102 and the read data buffer 104 have to be the same size, this may lead to under utilization of memory in the FIFO's in situations were the amount of data coming into one of the FIFO's is less than that coming into the other FIFO. The FIFO circuit 100 also requires one or more multiplexers having a large fan-in (both the write 102 and read 104 both FIFOs each require a 16:1 mux), this large fan-in has the potential of taking away a big margin of timing. To solve the timing problem, often the outputs are registered, causing the design area to be increased and performance to be reduced by a latency of one extra clock cycle.

BRIEF DESCRIPTION OF THE DRAWINGS

The features of the present invention, which are believed to be novel, are set forth with particularity in the appended claims. The invention may best be understood by reference to the following description, taken in conjunction with the accompanying drawings, in the several figures of which like reference numerals identify like elements, and in which:

FIG. 3 shows a more detailed view of the multi-input memory used in the FIFO circuit shown in FIG. 2.

DETAILED DESCRIPTION

Figure 1:
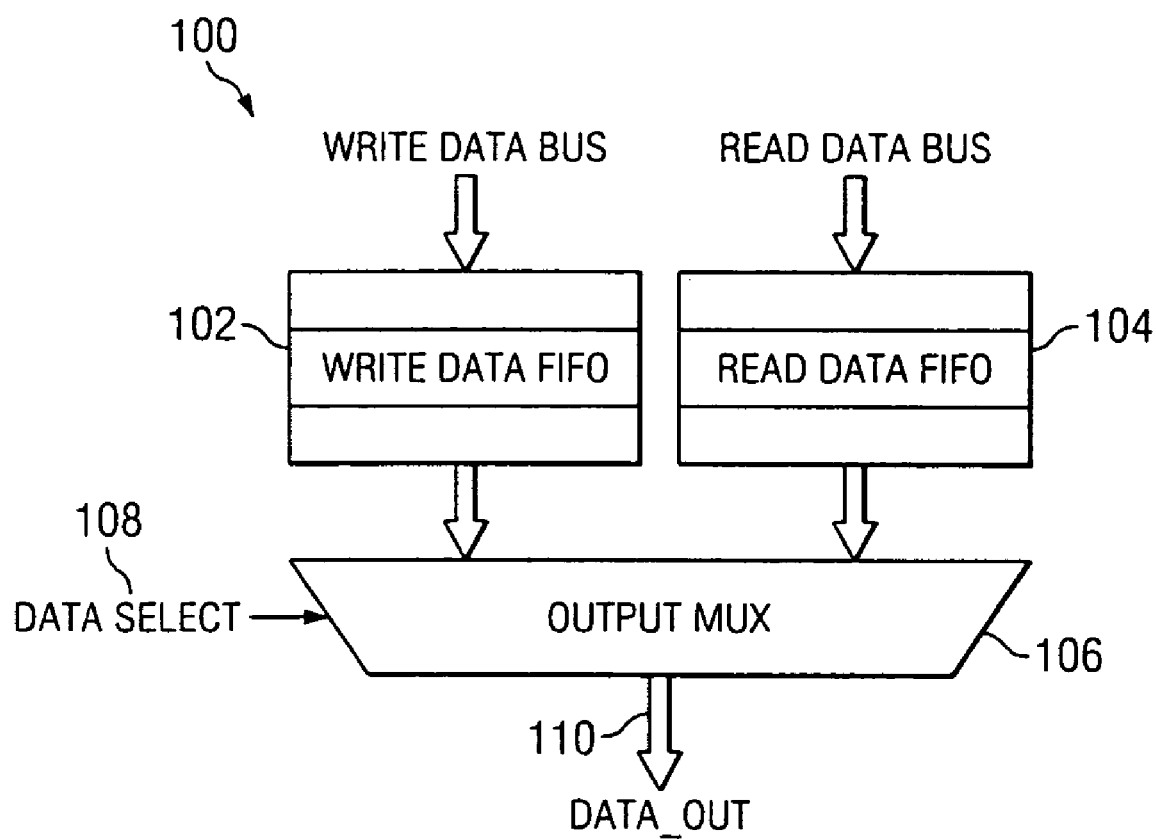
FIG. 1 shows a block diagram of a prior art FIFO circuit.

While the specification concludes with claims defining the features of the invention that are regarded as novel, it is believed that the invention will be better understood from a consideration of the following description in conjunction with the drawing figures.

An electronic device such as a bridge device or trace device needs to capture data from multiple input busses and present the data on another interface bus. A trace device is sometimes used to acquire and observe system activity in a passive mode in order for example to trace error conditions, etc. Problems encountered with these types of devices are that the read and write data may not be available at the same time, or a late read data may appear in the same cycle as a write data for the current transfer. These problems are addressed by the FIFO circuit of the present invention.

Figure 2:
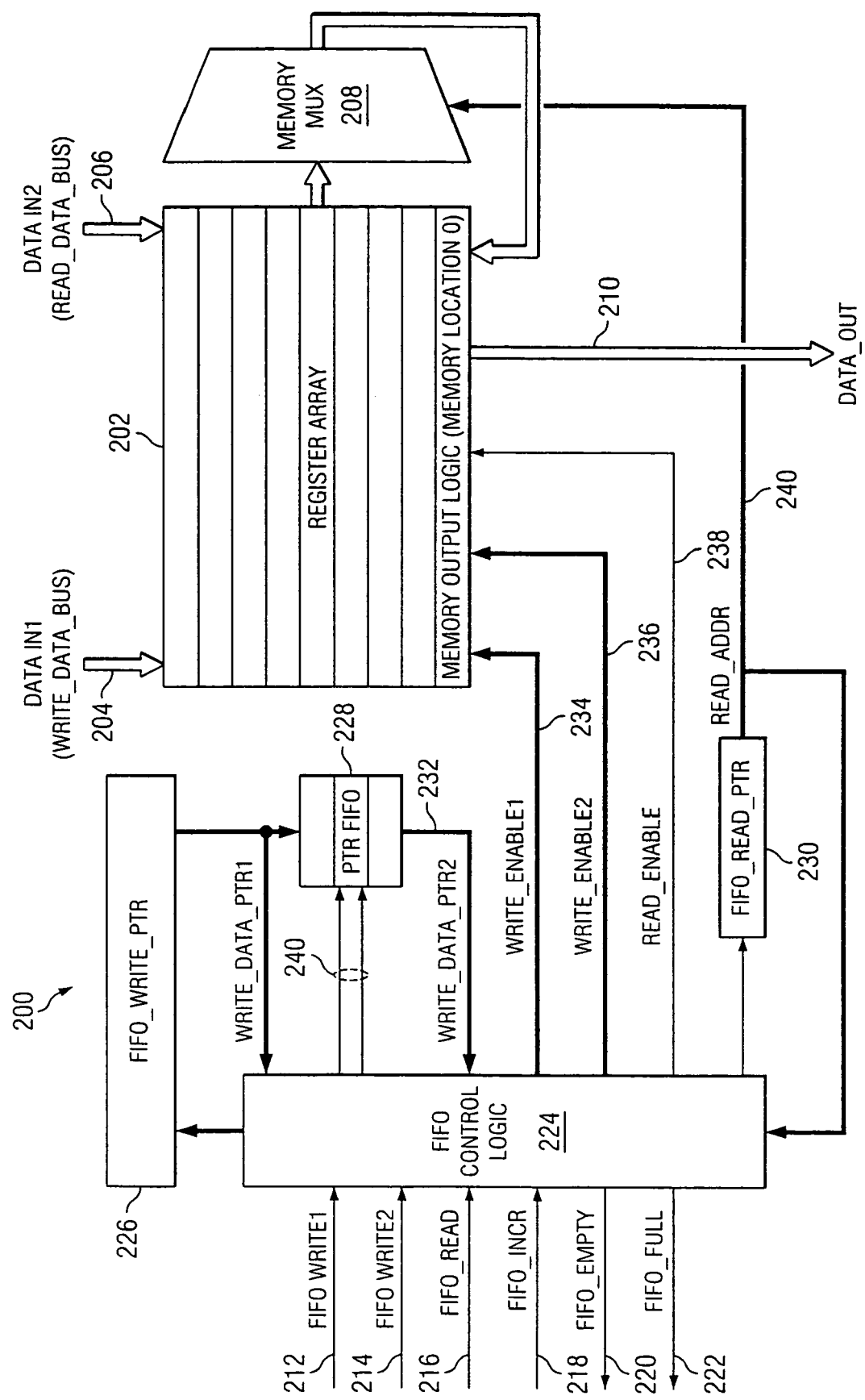
FIG. 2 shows a FIFO circuit in accordance with one embodiment of the invention.

Referring now to FIG. 2, there is shown a multi-input FIFO circuit 200 in accordance with an embodiment of the invention. In the illustrative example shown in FIG. 2, two data inputs DATA IN1 and DATA IN2, labeled WRITE_DATA_BUS 204 and READ_DATA_BUS 206 respectively. The WRITE_DATA_BUS 204 and READ_DATA_BUS 206 inputs are coupled to a single memory structure or register array 202. The memory can be either synchronous (clocked design) or asynchronous depending on the particular design. A counter 226 labeled as FIFO_WRITE_PTR drives the write address for writing data from the WRITE_DATA_BUS 204 into the register array 202. The output of FIFO_WRITE_PTR 226 labeled WRITE_DATA-PTR1 is also coupled to a single input/single output FIFO labeled PTR_FIFO 228. FIFO control logic 224 controls the PTR_FIFO 228 so that it either stores the value of the FIFO_WRITE_PTR 226 or reads out a stored value using control lines 240. The output of PTR_FIFO 228, (WRITE_DATA_PTR2) 232, is used to select the destination address in the register array 202 for data coming in from the READ_DATA_BUS 206 input that needs to be stored.

The FIFO control logic 224 receives the external input control signals for FIFO_WRITE1 212, FIFO_WRITE2 214 and FIFO_READ 216 from external circuitry that is not shown. In an illustrative example, these input control signals can originate from control logic that is part of a bus tracer device; although any other circuit(s) can provide these signals. The FIFO control logic 224 also provides external output signals FIFO_EMPTY 220 and FIFO_FULL 222 whenever the register array 202 is empty or full respectively. In an illustrative example where FIFO circuit 200 is used in a trace device, whenever a write command is detected, the FIFO_WRITE1 line is asserted. In response to the FIFO_WRITE1 line being asserted (as an example, this could either be a high or low logic signal depending on the particular design), the FIFO control logic 224 asserts the WRITE_ENABLE1 bus 234 and the data from WRITE_DATA_BUS 204 is written into the memory 202 at the address location pointed by the FIFO_WRITE_PTR 226. After the data is written into the memory 202, the FIFO control logic 224 increments the value (WRITE_DATA_PTR1) stored in the FIFO_WRITE_PTR counter 226.

If a read command is detected by the external circuitry (trace device, etc.) that is attached to FIFO circuit 200, the FIFO_INCR signal 218 is asserted. In response to the FIFO_INCR input 218 being asserted, the FIFO control logic 224 writes the value (FIFO_DATA-PTR1) stored in the counter FIFO_WRITE_PTR 226 into the PTR_FIFO 228 and then increments the value stored in the FIFO_WRITE_PTR counter 226. In this way, the next memory location of register array 202 is reserved for writing the data from the READ_DATA_BUS 206. As such the PTR_FIFO 228 acts in a fashion to reserve locations in the memory array 202 for any data coming in from the READ_DATA_BUS input 206. The size of the PTR_FIFO 228 will depend on the particular system design requirements.

Whenever the data from the READ_DATA_BUS 206 is available, the FIFO_WRITE2 214 input is asserted. In response to the FIFO_WRITE2 214 input being asserted, the data from the READ_DATA_BUS 206 is written at a location pointed by the FIFO_WRITE_PTR2 232. It is possible for the FIFO circuit 200 to simultaneously capture data from the WRITE_DATA_BUS 204 and READ_DATA_BUS 206 and store them into two different locations in the register array 202.

When the FIFO memory 202 is empty, the values stored in the FIFO_WRITE_PTR 226 and the FIFO_READ_PTR 230 are both equal to zero. During operation, the FIFO_WRITE_PTR 226 needs to wrap around, at which time, the pointer wraps around to a value of 0×1 (and not 0×0). Similarly, whenever the FIFO_READ_PTR 230 has to wrap around, it goes to a value of 0×1. These values can of course be modified depending on the particular system design requirements.

Whenever the FIFO_WRITE_PTR 226 increments and reaches the value of the FIFO_READ_PTR 230, the FIFO memory 202 is determined to be full. The FIFO control logic 224 constantly compares the next value of FIFO_WRITE_PTR 226 against the current value of the FIFO_READ_PTR 230. If these two match, and if there is a FIFO write, then the registered FIFO_FULL output 222 is asserted.

When the FIFO_READ_PTR 230 increments and reaches the value of FIFO_WRITE_PTR 226, the FIFO register array 202 is said to be near empty. When the register array 202 is near empty, it is assumed that there is only one data element left in the FIFO register array 202 and the remaining data is located in the memory location 0. While the FIFO 202 is nearly empty, if the FIFO_READ input 216 and/or either the FIFO_WRITE1 input 212 or FIFO_INCR input 218 are asserted the FIFO circuit 200 operates in normal fashion. However, if only the FIFO_READ input 216 is asserted, the FIFO register array 202 becomes empty. The control logic 224 detects this condition and resets the FIFO_WRITE_PTR 226 as well as the FIFO_READ_PTR 230 both to zero.

It is possible that while the WRITE_PTR2 232 has reserved a write location in the FIFO memory 202 all other data elements have been read out. Since the memory location is only reserved by WRITE_DATA_PTR2 232 and the actual data is not yet written into the memory 202, it is not possible to copy the actual data into memory location 0. In this case, the FIFO control logic 224 overrides the location pointed by WRITE_DATA_PTR2 232 and redirects the incoming data from the READ_DATA_BUS 206 to memory location 0 in the FIFO register array 202.

It should be noted that although two data inputs 204 and 206 are shown coupled to memory 202, the present invention can operate with only one or more than two data inputs if so required. Also, although memory location zero of the memory 202 is used as the memory location coupled directly to the data output 210 any of the other memory locations found in memory 202 can be used.

Referring to FIG. 3, a more detailed view of the dual input register array 202 along with memory multiplexer 208 of FIG. 2 are shown. The two inputs to the memory array 202 in this embodiment are the WRITE_DATA_BUS (or first data input, DATA IN1) 204 and the READ_DATA_BUS (or second data input, DATA IN2) 206. Each bit in the port WRITE_ENABLE1 234 and WRITE_ENABLE2 236 signals select a single row of registers to write. For instance, WRITE_ENABLE1 [0] (bit zero of the signal) selects the register at location 0 for writing, and so on. The write location for the input data coming in from DATA_IN1 204 is selected by WRITE_ENABLE1 234 and the write location for the input data coming from DATA_IN2 is selected by WRITE_ENABLE2 236. In the special case where a single row (memory location) is selected by both the WRITE_ENABLE1 234 and WRITE_ENABLE2 236 addresses, the input data from WRITE_DATA_BUS (DATA_IN1) 204 is written into memory 202 and the data from the DATA_IN2 206 input is ignored.

In order to provide a higher timing budget to the external logic coupled to the memory 202, the output, DATA OUT 210, of the memory 202 is directly driven from the registers mapped at memory location 0 (302). By using the memory location 0 (302) as the output, it is possible to write a scalable code using generics. Since the memory location 0 (302) itself is an output, this memory architecture has no extra latency for the first data in to data out. To read any other memory location, the data from the other memory location has to be copied on to the memory location at address 0. For this reason, the outputs of the rest of the memory registers are multiplexed using the MEMORY MUX 208 and then fed to the multiplexers that select data for memory location 0 via bus 304.

Whenever, one of the WRITE_ENABLE1[0] (bit zero of WRITE_ENABLE1, 234) or WRITE_ENABLE2[0] (bit zero of WRITE_ENABLE2, 236) is asserted, the write data from the corresponding data bus is written to memory 0 (302). In absence of any writes, whenever READ_ENABLE 238 is asserted, the data from the memory Mux 208 is written over to memory 0 (302).

FIFO circuit 200 allows for data from multiple data streams (DATA IN1 and DATA IN2) to be stored in a single memory 202. In a bridge or tracer circuit application, if the data input is available along with its command it is stored immediately, if the second data input is not available with its command, the current memory location can be reserved for it and the FIFO write pointer is advanced. Some of the advantage provided by FIFO circuit 200 includes minimized semiconductor area for manufacture since only one large memory 202 is required as compared to the prior art FIFO circuit 100 shown in FIG. 1. The design also reduces the number of flip-flops required providing for a reduction in the overall leakage power and power consumption as compared to some prior art FIFO circuits. Since the FIFO output is also registered, it provides good output timing and potentially saves on the use of an external register stage.

As an illustrative comparison, for an application of a trace device having a bus width of 64 bits and a memory depth of 11, a trace device using the conventional FIFO circuit 100 would use 1408 flip-flops (64×11×2). This can be compared to the same design using the FIFO circuit 200 of the present invention were only 748 flip-flops are needed (64×11 for register array 202)+(4×11 for PTR FIFO 228.) This reduction in the number of flip-flops required for the circuit helps reduce the semiconductor area needed for the design.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A first-in first-out (FIFO) circuit, comprising:
   a memory including a plurality of memory locations and the FIFO circuit further comprising a multiplexer including a plurality of inputs, the plurality of multiplexer inputs coupled one to each of the plurality of memory locations, the multiplexer including an output coupled to a specific one of the plurality of memory locations;

first and second input ports coupled to the memory, the first and second inputs receiving data that is to be stored in the memory;

an output port coupled to the memory for outputting data from the memory array; and means for controlling the storage of data from the first and second input ports into the memory.

2. The FIFO circuit as defined in claim 1, wherein the output port of the memory is coupled to the same specific one of the plurality of memory locations as the output of the multiplexer such that the data outputted from the memory is data that is stored in the specific one of the plurality of memory locations.

3. The FIFO circuit as defined in claim 2, wherein the means for controlling the storage of data includes a counter for storing a pointer to the memory location from among the plurality of memory locations in the memory where the next data received on the first input port is to be stored.

4. The FIFO circuit as defined in claim 3, wherein the means for controlling the storage of data also includes a single input/single output FIFO coupled to the counter, the single input/single output in response to receiving a control signal stores pointers to address locations within the memory for storing data received on the second input port.

5. The FIFO circuit as defined in claim 4, wherein the wherein the pointers stored by the single input/single output FIFO are received from the counter.

6. The FIFO circuit as defined in claim 4, further comprising a read data counter coupled to the multiplex.

7. The FIFO circuit as defined in claim 4, wherein the memory comprises a register array comprising a plurality of storage locations.

8. The FIFO circuit as defined in claim 6, wherein the means for storage of data further includes a control circuit for controlling the operation of the counter, the single input/single output FIFO and the read data counter.

9. A storage circuit, comprising:
a memory having a plurality of storage locations;
a data input coupled to the memory;
a counter;
a multiplexer having a plurality of inputs one each of said plurality of inputs coupled to one of the storage locations in the memory, the multiplexer having an output, the output of the multiplexer coupled to one of the plurality of storage locations of the memory; and
the counter stores pointer information regarding the address location in which to store data received on the data input.

10. The storage circuit as defined in claim 9, further comprising a controller circuit for controlling the storage of data within the memory.

11. The storage circuit as defined in claim 10, wherein the memory comprises a register array.

12. The storage circuit as defined in claim 11, further comprising:
one or more data outputs for outputting data stored in the memory, all of the data outputs coupled to a specific one of the plurality of storage location found in the memory.

13. The storage circuit as defined 10, further comprising:
a second data input coupled to the memory;
a first-in/first-out (FIFO) circuit having an input coupled to the counter, the FIFO circuit storing information regarding address location(s) for storing data received on the second data input.

14. The storage circuit as defined in claim 13, wherein the control circuit updates the counter so that it points to the next storage location in the memory for storing data received on the data input and controls the FIFO circuit so that it provides information regarding address location(s) for storing data received on the second data input.

15. The storage circuit as defined in claim 9, wherein the memory comprises a register array.

16. A method for storing data into a first-input/first output memory having a plurality of storage locations, comprising:
providing first and second data inputs for receiving data to be stored in the memory;
controlling the storage of data received on the first and second data inputs into the memory using a counter and a storage area; and
outputting data from the memory using a particular one of the plurality of storage locations for all data that is to be outputted from the memory.

17. The method for storing data as defined in claim 16, wherein the controlling step includes the steps of:
storing in the counter a pointer to the address location for the storage location within the memory were data received on the first data input is to be stored; and
storing in the storage area a pointer to the storage location within the memory were the data received on the second data input is to be stored.

18. The method as defined in claim 17, wherein data received on the first and second inputs can be stored in the memory at substantially the same time.

19. The method as defined in claim 17, wherein the memory comprises a register array.

* * * * *